United States Patent [19]
Collins

[11] Patent Number: 5,337,024
[45] Date of Patent: Aug. 9, 1994

[54] PHASE LOCKED LOOP FREQUENCY MODULATOR USING FRACTIONAL DIVISION

[75] Inventor: Ray L. Collins, Cedar Rapids, Iowa

[73] Assignee: Rockwell International Corporation, Seal Beach, Calif.

[21] Appl. No.: 81,034

[22] Filed: Jun. 22, 1993

[51] Int. Cl.⁵ .............................................. H03C 3/09
[52] U.S. Cl. ................................. 332/127; 375/44; 455/42; 455/76; 455/113
[58] Field of Search ................... 332/127, 128; 375/44; 455/42, 76, 113

[56] References Cited

U.S. PATENT DOCUMENTS

| | | | |
|---|---|---|---|
| 4,068,199 | 1/1978 | Madoff | 332/127 |
| 4,543,542 | 9/1985 | Owen | 332/128 |
| 4,546,331 | 10/1985 | DaSilva et al. | 332/128 |
| 4,800,342 | 1/1989 | Jackson | 331/10 |
| 4,810,977 | 3/1989 | Flugstad et al. | 332/127 |
| 4,816,774 | 3/1989 | Martin | 331/1 A |
| 4,833,425 | 5/1989 | Culican, Sr. et al. | 331/1 A |
| 4,994,768 | 2/1991 | Shepherd et al. | 332/127 |
| 5,021,754 | 6/1991 | Shepherd et al. | 332/128 |
| 5,038,117 | 8/1991 | Miller | 331/16 |
| 5,038,120 | 8/1991 | Wheatley et al. | 332/128 |
| 5,070,310 | 12/1991 | Hietala et al. | 331/1 A |
| 5,079,519 | 1/1992 | Ashby et al. | 331/1 A |
| 5,093,632 | 3/1992 | Hietala et al. | 331/1 A |
| 5,111,162 | 5/1992 | Hietala et al. | 332/127 |
| 5,166,642 | 11/1992 | Hietala | 331/1 A |

Primary Examiner—Siegfried H. Grimm
Attorney, Agent, or Firm—Kyle Eppele; M. Lee Murrah; H. Fredrick Hamann

[57] ABSTRACT

A frequency modulation circuit includes a phase-locked loop having a reference frequency input and a controlled frequency output. The phase-locked loop has a phase detector, a filter and a voltage-controlled oscillator and, in a feedback path between the output and the phase detector, a frequency divider. Also included is a converter converting an input signal to a digital modulation signal M, and an adder inverting the most significant bit of the digital modulation signal and adding it to a digital word representing a selected frequency. The frequency divider divides a fractional number $(N.F) \pm M$, where N is an integer, F is a fraction and M is the digital value of modulation data. This configuration is advantageous because data can be taken directly from the analog-to-digital output to the adder with no data translation, the modulation signal M could also be provided from a processor data bus, the peak deviation is selectable, and no carrier offset results from injecting the modulation signal into the phase-locked loop.

14 Claims, 2 Drawing Sheets

PHASE LOCKED LOOP FREQUENCY MODULATOR USING FRACTIONAL DIVISION

FIELD OF THE INVENTION

The present invention relates generally to frequency signal manipulation and, more particularly, to circuits and methods of frequency synthesis useful, for example, in radios with fractional-N division to provide an output frequency which is related to a reference frequency by a rational divisor N.F, where N is the integer part and F is the fractional part of the divisor.

BACKGROUND OF THE INVENTION

A frequency synthesizer is an apparatus which generates an output signal having a frequency which is an exact multiple of a reference frequency. The accuracy of the output signal frequency is typically determined by the accuracy and stability of the reference frequency source.

A common type of frequency synthesizer uses a phase-locked loop (PLL) to provide an output signal having a selectable, precise and stable frequency. The PLL includes a phase detector, a voltage-controlled oscillator (VCO) and, a feedback path arranged so that the phase of the VCO output is forced to be synchronous with the phase of the input reference frequency.

By using a divider circuit in the VCO feedback path and selectably controlling the division ratio, a variable frequency can be provided at the output of the frequency synthesizer. In this manner, the VCO output frequency is divided by the selectable divisor, and the VCO output frequency is an exact multiple of the reference frequency. If the divisor N is an integer, the smallest increment in the VCO output frequency value is necessarily equal to the magnitude of the reference frequency itself.

Accordingly, in order to provide a frequency synthesizer having a small step size between adjacent output frequencies, a very low reference frequency is required. Using a very low reference frequency, however, limits the frequency range and extends the time required for the PLL to settle (or lock) once a new frequency has been selected.

A common technique used to synthesize output signals having a frequency which is a rational multiple of the reference signal frequency is referred to as fractional-N synthesis. Typically, frequency divider circuits are implemented, so that they only divide by an integer value and it is necessary to simulate fractional division by changing the divisor integer value temporarily during the division process. This type of method, which is exemplified in U.S. Pat. No. 3,928,813 (Smith), incorporated herein by reference, requires significant additional circuitry for the fractional-division simulation and is, therefore, expensive to implement.

Other techniques used to synthesize output signals having a frequency which is a non-integer multiple of the reference signal frequency are referred to in U.S Pat. Nos. 4,068,199 (Madoff), 4,543,542 (Owen), 4,546,331 (DaSilva et al.), 4,800,342 (Jackson), 4,810,977 (Flugstad et al.), 4,816,774 (Martin), 4,833,425 (Culican, Sr. et al.), 4,994,768 (Shepherd et al.), 5,021,754 (Shepherd et al.), 5,038,117 (Miller), 5,038,120 (Wheatley et al.), 5,070,310 (Hietala et al.), 5,079,519 (Ashby et al.), 5,093,632 (Hietala et al.), and 5,111,162 (Hietala et al.), 5,166,642 (Hietala), all of which are herein incorporated by reference.

Another problem common to many of the known synthesizer PLL circuits is that they fail to provide an accurate and practicable way of frequency modulating the carrier injection signal for the radio transmitter. Previous efforts to achieve this end have resulted in essentially two sections of circuitry, one section using a PLL for narrow band frequency adjustment and another section for wideband frequency modulating a PLL output or input signal before the power amplifier of the radio transmitter. Such circuitry is duplicative and relatively expensive to implement in terms of both power and silicon space.

Accordingly, there is a need for a technique of frequency synthesis using fractional-N division which overcomes these deficiencies of the prior art. This need is especially prevalent in radio applications requiring frequency modulation in relatively narrow bands, for example, in spectral bands where frequency hopping is used.

SUMMARY OF THE INVENTION

The present invention provides a technique of frequency synthesis using fractional-N division which overcomes certain deficiencies of the prior art and is further advantageous because the present invention can be implemented using very little additional circuitry.

The present invention provides a frequency modulation circuit comprised of a PLL having a reference frequency input and a controlled frequency output. The PLL has a phase detector, a filter, a VCO and, in a feedback path between the output and the phase detector, a frequency divider. Also included, is a converter for converting an input signal to a digital modulation signal M by inverting its most significant bit (MSB), and an adder that adds the converted digital modulation signal to a digital word that represents a selected frequency. The frequency divider then divides by a fractional number (N.F)±M, where N is an integer, F is a fraction and, M represents modulation data.

The above summary is not intended to describe each aspect of the present invention, as this is the purpose of the discussion below.

BRIEF DESCRIPTION OF THE DRAWINGS

Other objects and advantages of the invention will become apparent upon reading the following detailed description and upon reference to the drawings in which.

Figure 1:
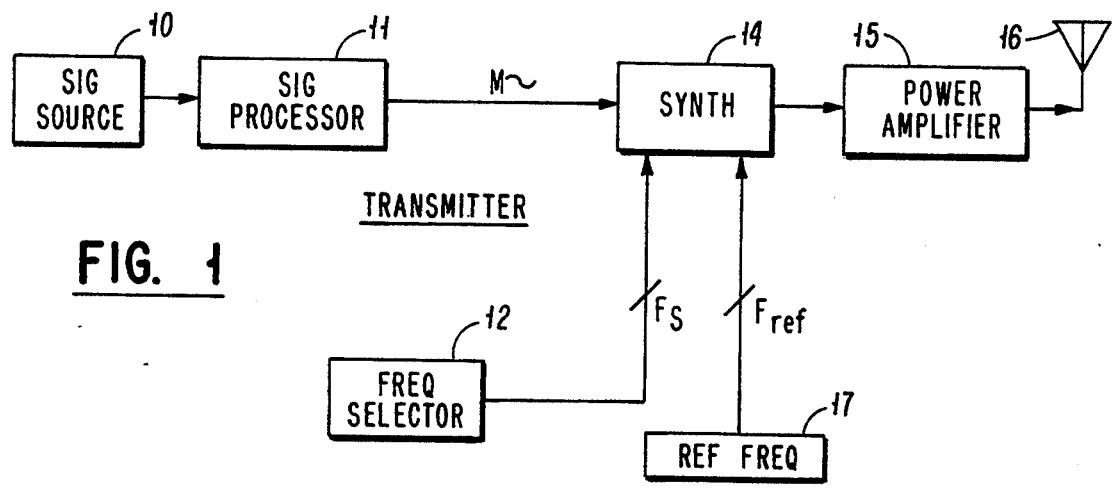
FIG. 1 is a block diagram of a radio transmitter, according to the present invention.

While the invention is susceptible to various modifications and alternative forms, a specific embodiment thereof has been shown by way of example in the drawings and will be described in detail. It should be understood, however, that it is not intended to limit the invention to the particular form described. On the contrary, the intention is to cover all modifications, equivalents and alternatives falling within the spirit and scope of the invention as defined by the appended claims.

DETAILED DESCRIPTION OF THE SPECIFIC EMBODIMENTS

Turning now to the drawings and particularly to FIG. 1, a radio transmitter, in accordance with the present invention, is shown to include a signal source 10, such as a data terminal (computer) or audio amplifier, providing a signal which is processed by a signal processor 11 which, in turn, provides a signal M for modulating a selected radio carrier frequency. The radio carrier frequency is selected by a conventional frequency selector 12, and a synthesizer 14 provides the frequency modulated output signal $F_o$ for radio transmission through a power amplifier 15 and an antenna 16.

The synthesizer 14 provides $F_o$ in response to three conventional signals: the input signal M, a frequency select signal $F_s$, and a reference frequency $F_{ref}$. The value of $F_s$ is a digital word having an integer part, which acts as a coarse frequency adjustment, and a fractional part, which acts as a fine tuning frequency adjustment. The value of $F_{ref}$ is provided by a conventional reference frequency generator 17, preferably a high-stability oscillator circuit. The signal processor 11, which is optional, may be used to provide the input signal M in either analog or digital form. The signal processor 11 is used for filtering and level-adjusting the signal M before it is provided to the synthesizer 14 for modulating the radio's carrier frequency.

Figure 2:
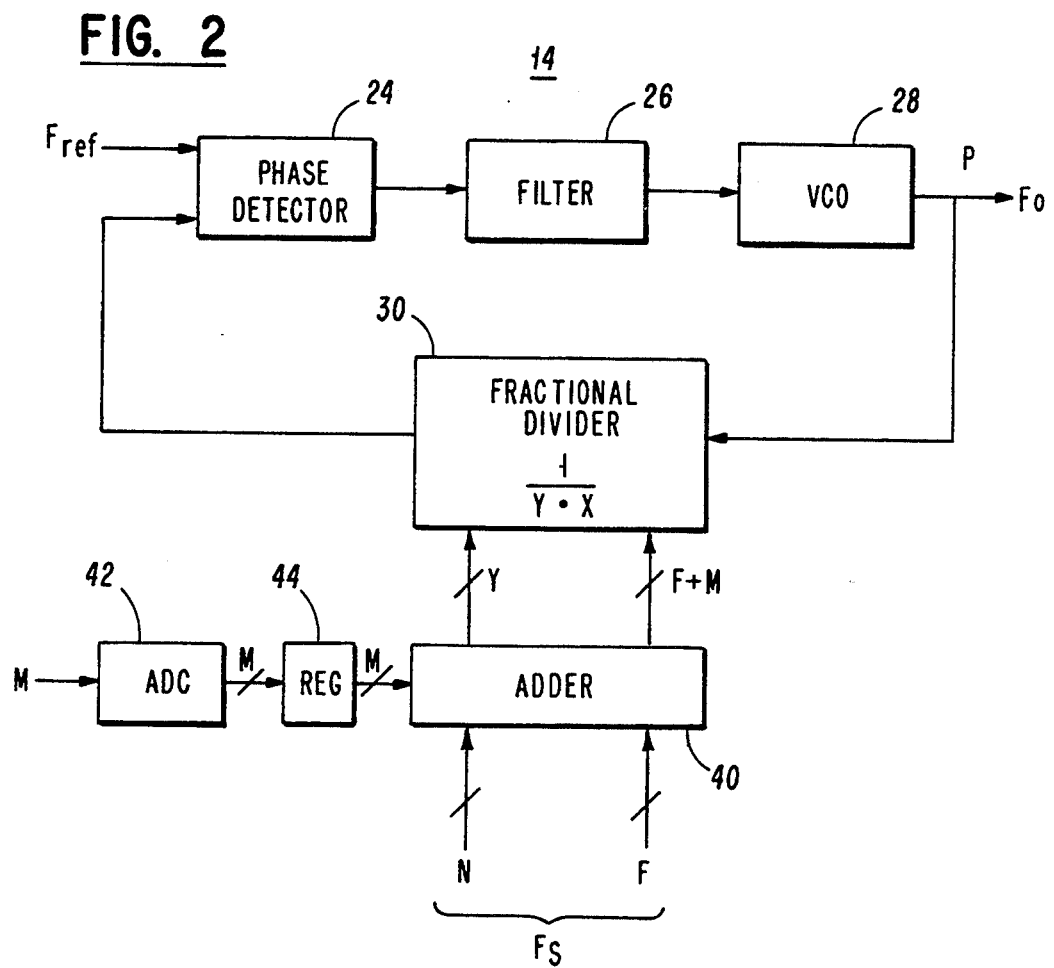
FIG. 2 is a block diagram of a synthesizer used in the radio transmitter of FIG. 1, also in accordance with the present invention.

Referring now to FIG. 2, the synthesizer 14 of FIG. 1 is shown to include a PLL consisting of a phase detector 24, a filter 26 (such as a low-pass-filter), a VCO 28 and, in a feedback path between the output port P of signal $F_o$ and the phase detector 24, a fractional frequency divider 30. The phase detector 24 compares its two inputs, a reference frequency $F_{ref}$ and the output of the fractional frequency divider 30, to accomplish phase synchronization. This is done by determining if there is any difference in phase between the two signals. If a phase difference is detected, the phase detector generates a corresponding error voltage, which is applied to the VCO 28 raising or lowering its frequency until the phase difference disappears. The bandwidth of the PLL is controlled by the filter 26, the bandwidth being set sufficiently small to remove noise and sufficiently large to allow the PLL to pull into the locked mode quickly in response to a new frequency assignment from the frequency selector 12 (see FIG. 1), accomplished by a change in the divide number N.F.

The fractional frequency divider 30 provides the signal against which the phase detector 24 compares $F_{ref}$ for any measureable difference. By dividing the VCO output $F_o$ by a fractional number Y.X when the PLL is phase locked $F_o$ will average Y.X times $F_{ref}$ over a sufficiently long period of time. By selectively controlling the frequency select signal input N.F., $F_o$ is a selected fractional multiple of $F_{ref}$.

An important aspect of the present invention is that frequency modulation may be incorporated into the PLL without requiring a customized fractional frequency divider. The fractional frequency divider 30 may be implemented, for example, in accordance with the fractional frequency divider taught in U.S. Pat. No. 5,038,117 (Miller) herein incorporated by reference.

An adder 40 provides the appropriate inputs to the fractional frequency divider 30, so that no other manipulation or translation of the signal M is required. Thus, the adder 40 provides these inputs in response to receiving M in digital form, and the frequency select signal $F_s$, depicted by its integer part N and its fractional part F. An analog-to-digital converter (ADC) 42, which can also be implemented as part of the signal processor 11, (see FIG. 1), provides signal M that is latched by multi-bit register 44 for processing by the adder 40. Frequency modulation centered around the carrier frequency is achieved by inverting the MSB of the signal M, treating the value of this signal as a fraction (O.M′) with sign extension, and adding this O.M′ number to the multi-bit digital number N.F. A signal representing the sum of this process, Y.X is coupled to the fractional divider 30 and provides the integer and fractional parts of the digital number.

For purposes of illustration only and not as a limitation on the teachings of the present invention, consider the following example where the multi-bit variables M, F, and N are twelve bits, twenty-four bits, and eleven bits, respectively. Accordingly, the MSB of M, would be located in the twelfth bit position ($b_{11}$) and the least-significant-bit (LSB) would be located in the first bit location ($b_o$). Similar determinations of the MSB and the LSB locations for N and F yield MSB locations of $b_{10}$ and $b_{23}$ for N and F, respectively. The adder 40 uses the MSB ($b_{11}$) of the signal M to indicate the sign of the modulation, positive or negative, with the remaining bits of signal M designating the magnitude of the modulation. A "1" as the MSB value indicates that the modulation is positive, and a "0" as the MSB value indicates that the modulation is negative. The adder 40 inverts the MSB before performing the determination of "1" or "0". This effectively sets a zero-magnitude modulation level at 100000000000, sets the most negative magnitude of modulation at 000000000000, and sets the most positive magnitude of modulation at 111111111111, so as to precisely center the modulation about the carrier frequency. Thus, with no modulation, the bit value of signal M is a one and all zeroes, and inverting the MSB converts the signal M to 000000000000, which the adder processes to effect no modulation in the PLL.

As part of this modulation centering, the adder 40 sign extends the converted signal M′ so that it is added to the number N.F using the same number of bits as represented by the number N.F. In the above example, the adder 40 sign extends the converted signal M′ so that it has thirty-five bits, with the twenty-three remaining bits being identical to the inverted MSB value of M. Assuming the value of M is equal to 000000000001, then after inversion of the MSB and sign extension, the modified signal M′ is 111 ... 11100000000001 (the last twelve digits representing the extension).

This modified signal M′ is then added to the number N.F, beginning with the LSB of M′ added to the LSB of F and continuing bit for bit until all of M's bits have been added to N.F. Mathematically, this can be represented as:

$$N.F + .M' = Y.X \text{ (FIG. 2)},$$

where M′ is the modified signal M after inversion of the MSB and sign extension through sufficient bits so as to match the bit length of the number N.F, where X equals M′ plus F, and where Y equals N plus any carryover from the addition of M′ plus F. Failing to sign extend the converted (MSB inverted) signal M′ results in an erroneous and, therefore, undesirable sum being provided to the fractional divider 30.

By selecting the bit length of the signal M to be less than the bit length of fractional part F of the fractional signal $F_s$, the peak deviation level can be set according to the position of the modified signal M on the right (or fractional) side of the number before the addition step. In the above example, the twelve bit signal M can be positioned with its LSB aligned with the LSB of the number part F. This will provide minimal deviation. By positioning the twelve bit signal M so that its MSB is aligned with the MSB of the number part F, maximum deviation is provided. Unused bits to the right of the twelve bit signal M, assuming the minimum deviation position is not chosen, are set equal to zero.

In the above example, there are twelve possible deviation levels that can be set in this manner, with each bit translation toward the integer part N representing an increase in deviation by a factor of two. The difference between the bit length of the signal M and the bit length of fractional part F of the fractional signal $F_s$, therefore, determines the number of deviation settings and the overall deviation magnitude made available by the adder 40.

Figure 3:
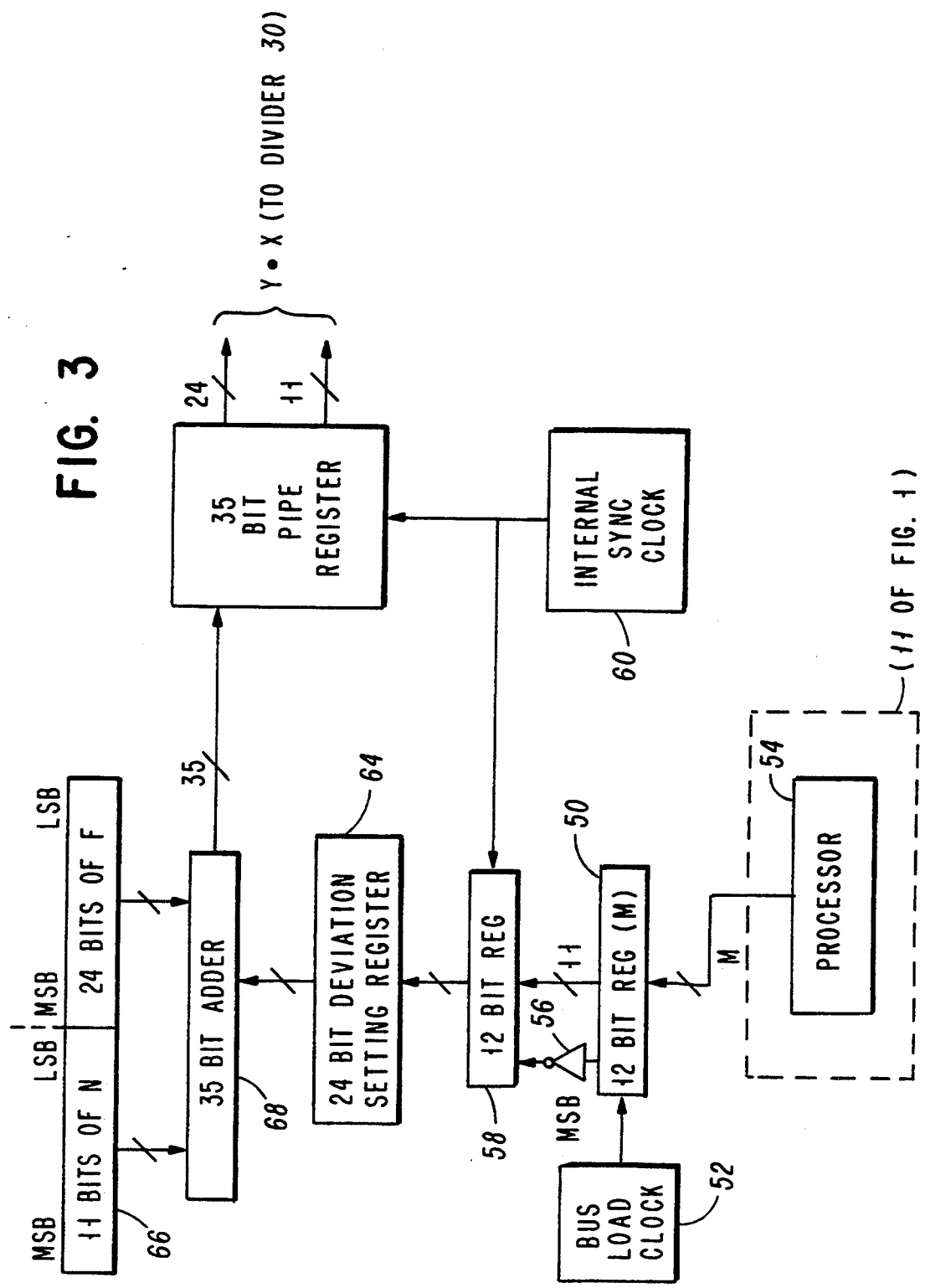
FIG. 3 is a block diagram of one implementation of the adder device of FIG. 2.

FIG. 3 illustrates this adder implementation, as exemplified above, in greater detail. A register 50, in response to a clock signal received by a bus load clock 52, latches the signal M directly from a data bus of a logic device 54 such as an ADC or microprocessor device. An inverter 56 then inverts the MSB value of the signal M and, with the remaining eleven bits, the converted signal M' is latched into a register 58 in response to a signal provided by an internal synchronization clock 60, which ensures that the modulating data from the signal source is being injected into the PLL in a timely manner. The output of the register 58 is transferred to a twenty-four bit deviation setting register 64 to set the peak deviation, by shifting its position as previously described. The output of the deviation setting register 64 is added, via a thirty-five bit full adder 68, to the N.F number which is provided by a thirty-five bit register 66. The output of the thirty-five bit full adder 68 is provided to a thirty-five bit pipe register, whose output Y.X is the divide number for a fractional divider.

Accordingly, the present invention provides a frequency modulation arrangement for use in combination with a PLL, where data is taken directly from the logic device output to the adder with no data translation, where the modulation signal can be provided directly from a processor data bus, the peak deviation is selectable by positioning the modulation signal, and no carrier offset results from injecting the modulation signal into the PLL. This significantly reduces the amount of circuitry required to implement the synthesizer and makes the invention ideal for implementation in an integrated circuit.

Those skilled in the art will readily recognize that various modifications and changes may be made to the present invention without departing from the true spirit and scope thereof. For example, although not preferred, the adder may be implemented using a conventional ROM look-up table so as to provide the digital input to the fractional divider 30 of FIG. 2 using the same teachings disclosed herein. Further, changing the number of bits used to implement each of the registers is not critical and can be selected according to the requirements of the particular application. For example, the twenty-four bit register 64 of FIG. 3 can be implemented using nineteen bits instead of twenty-four bits, the number of deviation settings being reduced by five. These and other such variations would not escape the true spirit of the present invention, which is set forth in the following claims.

I claim:

1. A frequency modulation circuit, comprising:
    a phase-locked loop having a reference frequency input and a controlled frequency output, the phase-locked loop having a phase detector, a filter and a voltage-controlled oscillator, the phase-locked loop also having a frequency divider in a feedback path between the output and the phase detector;
    a circuit providing a digital modulation signal M;
    an adder, responsive to the digital modulation signal M and a first digital word F representing a selected frequency, the adder inverting the most significant bit of the digital modulation signal M and providing a second digital word; and
    in response to the adder providing the second digital word, the frequency divider dividing the controlled frequency output by a fractional number Y.X, where Y is an integer part of the fractional number, and X is a fractional part of the fractional number.

2. A frequency modulation circuit, according to claim 1, wherein the adder adds the value of the digital modulation signal M, to the first digital word F.

3. A frequency modulation circuit, according to claim 1, wherein the adder converts the digital modulation signal M by inverting its most significant bit so that the converted digital modulation signal has a value that is set for modulation arithmetic around a digital value corresponding to a center frequency.

4. A frequency modulation circuit, according to claim 3, wherein the adder adds the converted digital modulation signal to the first digital word F; and
    sign extends the inverted most significant bit of the converted digital modulation signal up to the most significant bit of the input frequency word.

5. A frequency modulation circuit, according to claim 1, wherein the circuit providing the digital modulation signal includes an analog-to-digital converter, and the digital modulation signal M is provided from the analog-to-digital converter with no translation or special processing of the digital modulation signal.

6. A frequency modulation circuit, according to claim 1, wherein the adder converts the digital modulation signal M by inverting its most significant bit so that the converted digital modulation signal is a signed value that is set around a digital value of zero magnitude corresponding to a center frequency, the adder sign extends the inverted most significant bit, and the adder adds the converted digital modulation signal M to the first digital word F.

7. A frequency modulation circuit, according to claim 6, wherein when the adder adds the converted digital modulation signal M to the first digital word F, an overflow therefrom results in the addition of a carry-over bit.

8. A frequency modulation circuit, according to claim 6, wherein the circuit providing the digital modulation signal includes an analog-to-digital converter and the digital modulation signal M is provided from the analog-to-digital converter with no translation of the digital modulation signal M.

9. A frequency modulation circuit, according to claim 1, wherein the adder converts the digital modulation signal M by inverting its most significant bit, sign extends the inverted most significant bit, and adds the converted digital modulation signal M to a fractional number N.F.

10. A frequency modulation circuit, according to claim 1, wherein the signal M has a bit length less than the bit length of the fractional part of the fractional number Y.X.

11. A frequency modulation circuit, according to claim 10, wherein the signal M is shifted before said adding so as to set a desired deviation level.

12. A frequency modulation circuit, comprising:
a phase-locked loop having a reference frequency input and a controlled frequency output, the phase-locked loop having a phase detector, a filter and a voltage-controlled oscillator, the phase-locked loop also having a frequency divider in a feedback path between the output and the phase detector;
an analog-to-digital converter providing a digital modulation signal M; and
an adder,
receiving the digital modulation signal M and a first digital word F representing a selected frequency,
converting the digital modulation signal M by inverting its most significant bit,
sign extending the inverted most significant bit to provide a modified signal, and
adding the modified digital modulation signal to a fractional number N.F so as to provide a digital sum thereof Y.X, where N is an integer part and F is a fractional part of the fractional number corresponding to a selected frequency;
wherein the frequency divider divides the controlled frequency output by the fractional number Y.X.

13. A frequency modulation circuit, according to claim 12, wherein the signal M has a bit length less than the bit length of fractional part of the fractional number N.F.

14. A frequency modulation circuit, according to claim 13, wherein the signal M is shifted before said adding so as to set a desired deviation level.

* * * * *